June 18, 1963 G. V. YOUNG 3,094,662

AUTOMATIC FREQUENCY CONTROL

Original Filed Jan. 2, 1959 2 Sheets-Sheet 1

INVENTOR.
GEORGE V. YOUNG

AUTOMATIC FREQUENCY CONTROL

Original Filed Jan. 2, 1959 2 Sheets-Sheet 2

INVENTOR.
GEORGE V. YOUNG

United States Patent Office 3,094,662

Patented June 18, 1963

3,094,662

AUTOMATIC FREQUENCY CONTROL

George V. Young, Encino, Calif., assignor, by mesne assignments, to C. A. Motz

Continuation of application Ser. No. 784,693, Jan. 2, 1959. This application Jan. 31, 1963, Ser. No. 255,377

4 Claims. (Cl. 325—319)

Figure 1:
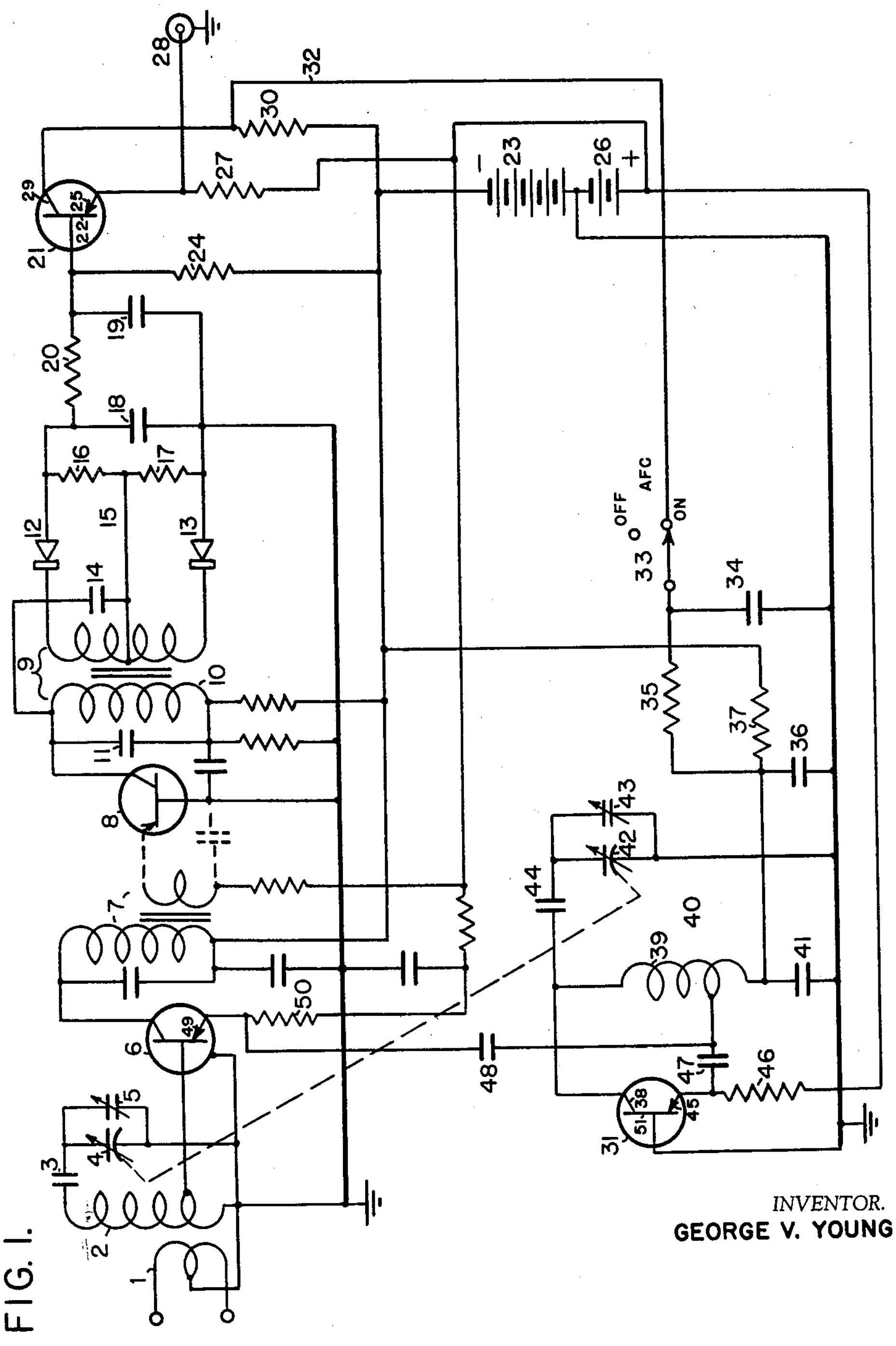

My invention relates to an automatic frequency control and particularly to an extremely simple one for a transistorized superheterodyne receiver. This is a continuation of patent application Serial No. 784,693 filed January 2, 1959.

The known art of automatic frequency control has usually required a considerable number of circuit components in addition to those required for the receiver per se, and often an additional vacuum tube. In my transistorized receiver for frequency modulation reception I have been able to accomplish highly effective automatic frequency control of the local transistor oscillator by merely adding two small resistors, a small capacitor and a connecting wire.

It is known that a diode semiconductor junction changes in capacitance when the energizing potential for the same is altered. This is because the region between the electrodes involved in which there are neither mobile electrons nor mobile holes is increased in thickness as the voltage applied between the electrods is increased. The "depleted" semi-conductor material in this region is a relatively good dielectric, thus the effect of a parallel plate capacitor of changing separation with applied potential is obtained.

I utilize this phenomenon between the base-collector junction of a PNP triode transistor of my local superheterodyne oscillator, the variation of capacitance with collector supply voltage causing a variation of capacitance in shunt to the inductance-capacitance resonant circuit of that oscillator.

My invention is briefly described as follows.

A two diode discriminator is required for demodulation of the frequency modulated signals in a frequency modulation receiver. An emitter-follower transistor is necessary and desirable to give a low impedance audio frequency output of the order of a volt for subsequent amplification in a high-fidelity audio system, or the equivalent in other fields of application. The audio output is taken from the emitter electrode of the emitter-follower. I merely add a resistor in the collector circuit of that transistor to give an independent source of output from the discriminator and a simple resistive-capacitative (RC) filter thereafter to remove both the intermediate frequency and the modulation frequency from that output. The resulting relatively constant potential is applied as an adjustment of the voltage supply fed to the collector electrode of the local oscillator. The required change in capacitance of the collector-base junction is in the correct sense and of the correct magnitude to keep the frequency of the local oscillator correct.

It is not difficult to obtain such a large effect that the receiver will stay on an FM station to which it has been initially tuned regardless of the fact that the tuning dial is turned from one end of the United States frequency modulation station band to the other. Normally, of course, the automatic frequency effect is reduced to only compensate for usual receiver frequency drift with temperature and supply voltage changes.

An object of my invention is to provide frequency control of a semiconductor oscillator by extremely simple means.

Another object is to provide automatic frequency control for a transistorized superheterodyne receiver in a simple manner.

Another object is to provide an extremely wide range of frequency control of a transistor oscillator.

Another object is to provide an inexpensive and light weight circuit for frequency control of a transistorized oscillator.

Other objects will become apparent upon reading the following detailed specification and upon examining the accompanying drawings, in which are set forth by way of illustration and example certain embodiments of my invention.

Figure 2:
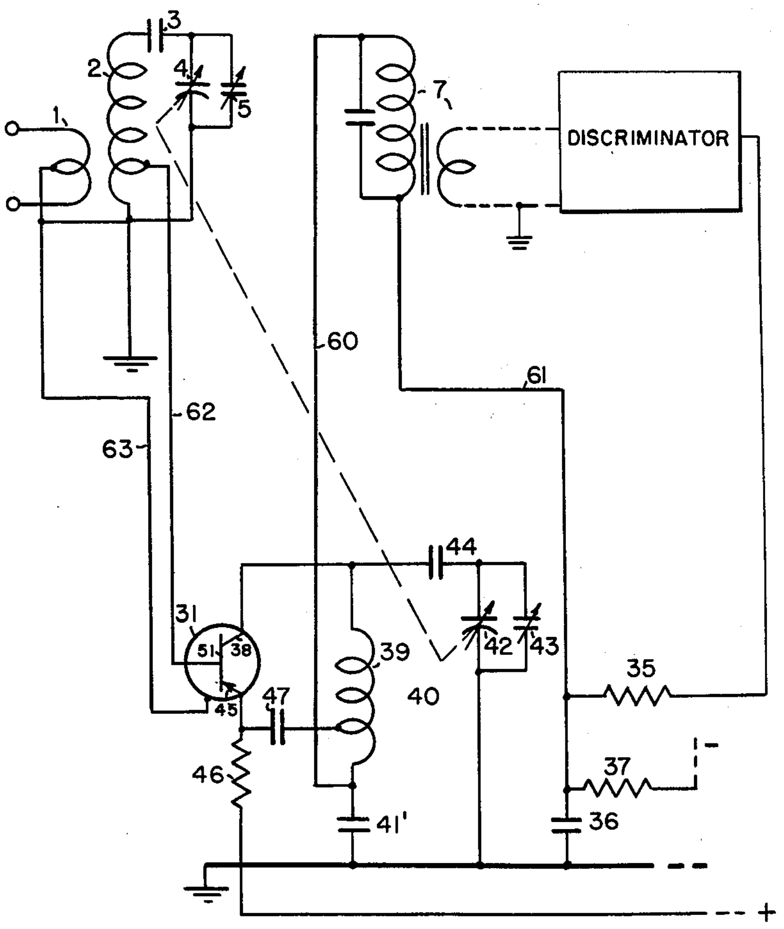

FIG. 1 shows a basic schematic diagram of a frequency modulation receiver employing my invention, and FIG. 2 shows an essential portion of the same, but with an autodyne oscillator-mixer.

In FIG. 1, numeral 1 indicates an antenna coupling coil. This is inductively coupled to inductor 2 of the input resonant circuit. The frequency band of this circuit is determined by the capacitance of series capacitor 3 and it is tuned to the station to be received by variable capacitor 4 and shunt trimmer capacitor 5.

Transistor 6 is the mixer or heterodyne first detector of the receiver. In this, the incoming signal and a local oscillator frequency different from that of the incoming signal by an amount equal to the intermediate frequency are heterodyned or "mixed" to obtain the modulation of the signal at an intermediate frequency.

The first intermediate frequency transformer 7 is connected to the collector electrode of transistor 6 and to the emitter of grounded base intermediate frequency amplifier transistor 8. The connections to the latter are shown dotted to indicate that more than one, say four, intermediate frequency stages may be included in a receiver by mere duplication of the showing of this portion of the diagram.

The collector of the transistor of the last intermediate frequency amplifier stage is connected to discriminator transformer 9. The primary thereof consists of resonant coil 10 and capacitor 11, similar to the prior intermediate transformer primaries, but the secondary is center-tapped in order to provide oppositely phased inputs for the discriminator diodes. These are similarly poled diodes 12 and 13 connected to the extremities of the secondary winding. Capacitor 14 provides a fixed phase signal that is compared with the phase of the secondary signal. Phase shift in the secondary with frequency provides a difference output to diodes 12 and 13. In the known manner discriminator 15 (the whole) gives an amplitude of voltage proportional to the change in frequency of the intermediate frequency impressed upon it. This includes the change in frequency at an audio rate of the frequency modulation of this broadcast service, for example, and also includes a slow variation proportional to any drift in frequency of the receiver local oscillator, or of the transmitter frequency, if this should occur.

The output of the discriminator is taken from the non-common extremity of resistor 16 of the terminal pair of resistors 16, 17 and passes to an intermediate-frequency-elimination filter composed of shunt capacitors 18, 19 and the intervening series resistor 20. The non-common extremity of resistor 17 is connected to ground.

Transistor 21 is the emitter-follower output device. The base 22 thereof is given a negative potential from battery 23, having a voltage of the order of nine volts, through resistor 24 of a fraction of a megohm resistance. Emitter 25 is given a positive supply potential from battery 26, having a voltage of the order of three volts. This is applied through resistor 27, of two thousand ohms resistance. The audio frequency or equivalent modulation output is taken from the emitter electrode and appears at jack 28.

As has been previously mentioned, collector 29 of transistor 21 has a resistor 30 in series therewith according to this invention and to the supply potential of minus nine volts from battery 23. This resistor is the one which provides the input to the automatic frequency control circuit and may have a resistance of approximately three thousand ohms. This resistor value is chosen to place the local oscillator transistor 31 on the central portion of its operating curve. The corresponding potential at the top thereof, at conenction 32, is six volts in illustrative embodiments.

Connection 32 connects to one contact of "AFC On-Off" switch 33; the second stationary contact of which is unconnected in order to remove the automatic frequency control from affecting the oscillator when this is desired. This may be when it is desired to receive a weak station near in frequency to a strong one, or to set the receiver tuning closely to the transmitter frequency so that the automatic frequency control, when applied, will be in the center of its control range. Capacitor 34, in shunt to ground to switch 33, removes residual intermediate frequency energy from the AFC control signal and may have a capacitance of .01 microfarad. Resistor 35 isolates the input and the output of this filter and also acts in promoting filtration. A resistance value of the order of a hundred ohms is satisfactory. Capacitor 36, also in shunt to ground and after the resistor, removes all of the modulation components from the discriminator-originated signal. To do this a large capacitance low voltage rating capacitance of one-hundred microfarads is indicated and the capacitor may be of the electrolytic type.

Resistor 37 is a collector-supply dropping resistor, connecting from the negative terminal of battery 33 to collector 38 of oscillator transistor 31 through coil 39 of oscillator resonant circuit 40. This resistor is chosen to provide an operating collector potential in the middle of the transistor characteristic and may be two thousand ohms for a negative potential of nine volts.

Capacitor 41 gives an alternating current ground to resonant circuit 40 without shorting out the necessary supply voltage to collector 38. A capacitance of .01 microfarad is satisfactory. Variable capacitor 42 is for tuning the oscillator resonant circuit and is mechanically ganged to a similar capacitor 4 for the mixer. As before, trimmer 43 provides vernier adjustment to establish tracking and capacitor 44 in series with these capacitors and coil 39 in the resonant circuit sets the band of frequencies covered as desired. A value of twenty-five micromicrofarads is suitable for capacitor 44.

Inductor 39 has a few turns of wire at a coil diameter of perhaps a half inch and capacitor 42 a range in values of from about 10 to 25 micromicrofarads for covering the United States frequency modulation (FM) band, which extends from 88 to 108 megacycles.

Emitter 45 of oscillator transistor 31 is provided with a plus three volts supply potential at the lower end of series resistor 46, which resistor has a resistance of between one and two thousand ohms.

A tap is taken from coil 39 to feed a relatively small fraction of the circulating resonant voltage of tank circuit 40 to the emitter 49 of mixer transistor 6. Capacitor 47 provides feedback in a connection between this tap and the emitter element of transistor 31, which is 45. A capacitance of only a few micromicrofarads is sufficient to accomplish this feedback.

Capacitor 48 provides A.C. coupling without D.C. potential from the coil tap to emitter 49 of transistor 6. The oscillator frequency voltage is properly allowed to appear on this emitter because of the impedance of resistor 50, which is a resistance of ten thousand ohms.

The mode of operation of my automatic frequency control is as follows.

When the resting frequency of the FM station carrier as reflected in the intermediate frequency generated by heterodyne in mixer 6 is in the center of the intermediate frequency band pass the "D.C." output at base 22 of emitter-follower transistor 21 is zero volts. Should this frequency be higher than the center value the voltage decreases to a maximum extent in my embodiments to a value of minus one volt and should the frequency be lower the voltage increases to a maximum of plus one volt.

Since the resistance value of resistor 30 was chosen to give minus six volts for the center frequency, a variation of this frequency will alter the potential there to other values within the range of minus five and minus seven volts. After the filtration previously described (through RC elements 34, 35, and 36), the proper "D.C." potential is impressed upon collector 38 to bring the frequency of the local oscillator to that frequency that will make the intermediate frequency for the station being received lie in the center of the intermediate frequency amplifier characteristic.

When the polarity shown (anodes of both diodes toward transistor 21), the variation of capacitance will be in the direction to give frequency control toward the center frequency. If the connections to the diodes are reversed, the automatic frequency control will cause the oscillator to go to an extreme error frequency rather than to seek a central equilibrium.

I have found that it is not difficult to obtain transistors for use in the oscillator 31 that will give all the frequency control desired. In the practical embodiment described I prefer a transistor which gives about three micromicrofarads capacitance change for one volt collector change. One such transistor is the type 2N588. Other transistors have been tested which give as much as one hundred micromicrofarads capacitance change per volt. Similar useful capacitance changes have been obtained with power transistors.

With my automatic frequency control a one-hundred megacycle frequency receiver is stable with respect to tuning regardless of temperature or supply voltage changes over wide ranges.

While my invention has been described in relation to an FM receiver it will be appreciated that the same circuit may be used for an amplitude modulated (AM) receiver. The frequency control and discriminator circuits are as shown in FIG. 1. The only modification is the addition of an ordinary amplitude-modulation detector to the output of the intermediate frequency amplifier to derive the modulation information. Since this is known technique this has not been illustrated.

I have constructed frequency-controlled oscillators of the type of transistor 31 for frequencies as low as one hundred cycles and have been able to change the operating frequency thereof to as high as one thousand cycles by the type of voltage variation set forth in this specification. The upper frequency limit to my invention is the upper frequency limit of usefulness of transistors as oscillators, which may be set at this time for commercial embodiments at five hundred megacycles.

The several unidentified resistors and bypass capacitors in the intermediate frequency amplifier of FIG. 1 will be recognized by those skilled in the art as the usual auxiliary components in this class of apparatus and thus need not be described for an understanding of this invention.

In the oscillator circuit shown the electrically controlled variation of capacitance is a shunting capacitance to the resonant circuit. The variation takes place between collector 38 and base 51. The latter electrode is connected to ground and the bottom of coil 39 is connected to an oscillation-frequency ground through low reactance capacitor 41. While I prefer an emitter-follower connection for transistor 21 and the type of oscillator circuit shown associated with oscillator transistor 31, these devices may be altered as desired as long as a voltage from a discriminator is secured that is effective in altering the supply voltage of an electrode of transistor 31 to provide a variation of capacitance effective in altering the resonant frequency of a resonant circuit, such as 40.

In the receiver circuit shown in FIG. 1 I have chosen to employ a separate mixer and oscillator so that mistuning effects of different antennas are a minimum.

However, it is possible to employ an autodyne circuit in the practice of my invention and this is shown in FIG. 2. The oscillator and mixer transistors become one. Transistor 6 is omitted and the connection from the top of the first intermediate transformer 7 primary is taken to the bottom of oscillator coil 39 via new connection 60 in FIG. 2. Bypass capacitor 41 is reduced in capacitance to approximately ten micromicrofarads and becomes capacitor 41' in FIG. 2. This is to provide a signal ground for the oscillator frequency but not to seriously attenuate the intermediate frequency energy. The bottom connection of the primary of I.F. transformer 7 is connected to the junction between resistors 35, 37 and capacitor 36 by means of new conductor 61.

In the radio frequency input circuit of FIG. 2 the tap on secondary coil 2 now goes to the base of transistor 31 via connection 62 (instead of to the same electrode of prior transistor 6). Similarly, the center tap of antenna coil 1 goes to the outer case of transistor 31 via connection 63 (instead of to the case of prior transistor 6).

In this way both incoming radio frequency energy and local oscillator frequency energy are present in transistor 31 and associated circuits and the intermediate frequency thus generated passes to the first intermediate frequency transformer 7. The AFC current for the oscillator 31 now passes from the junction of resistors 35, 37 and capacitor 36 via conductor 61, through the primary of intermediate transformer 7 and back via conductor 60, through coil 39 (as before) to collector 38, where the required variation of capacitance with potential occurs as has been explained.

As to the practicality of employing a small capacitor 41' as stated, in a typical instance the oscillator frequency may be one hundred megacycles and the intermediate frequency ten megacycles. For a lower carrier frequency the intermediate frequency would be correspondingly lower so that a similar frequency ratio would apply.

It will be appreciated that my invention allows utmost simplicity in obtaining automatic frequency control. Besides utilizing another electrode of an emitter-follower transistor required for modulation frequency output, the AFC capacitance variation takes place in the oscillator transistor per se. In my circuit a variable capacitance diode is not required as an additional element, with the additional auxiliary circuit elements required to make it function. Also, I do not have a degradation of the "Q" of the components of the resonant circuit, as occurs by conductive loading when an additional variable capacitance diode is employed.

Batteries 23 and 26 may be replaced by a power supply or supplies in the known manner for all-alternating current operation. I have employed a simple half-wave semiconductor rectifier-filter arrangement with a resistive output voltage-divider having a center tap grounded to give the large negative voltage supply and the smaller positive bias from one unit. It is not necessary that the voltage divider be individually bypassed with capacitors.

While the frequency modulation broadcast service has been inferred herein, my invention is fully applicable to the frequency modulation communications service and elsewhere where electrical control of frequency is desired.

Although specific examples of voltages and values for the several circuit elements have been given in this specification to illustrate the invention, it is to be understood that these are by way of example only and that reasonably wide departures can be taken therefrom without departing from the inventive concept. Other modifications of the circuit elements, details of circuit connections and alteration of the coactive relation between elements may also be taken under my invention.

I claim:

1. A radio frequency receiver automatic frequency control comprising a discriminator to provide an electrical output proportional to the intermediate frequency impressed upon said discriminator and to provide modulation frequency variations, a filter connected to said discriminator to remove modulation frequency variations at the output of said filter, an oscillator transistor having emitter, base and collector electrodes, an oscillatory circuit having only a parallel type resonant circuit, said resonant circuit connected to said collector electrode, and to a radio frequency ground, said base electrode connected directly to ground, and the output of said filter conductively connected exclusively to the same said collector electrode through said resonant circuit; the frequency of said oscillatory circuit changed by a change of voltage on said collector electrode derived from said discriminator and poled to give an equilibrium oscillatory frequency for accomplishing automatic frequency control.

2. In an autodyne receiver an automatic frequency control comprising a frequency discriminator circuit to give an electrical voltage output proportional only to the departure of the intermediate frequency of said receiver from a mean value, a single receiver oscillator and mixer junction transistor having an emitter, a collector and a base, an oscillator inductor-capacitor parallel resonant circuit and said discriminator circuit conductively connected to said collector and to a signal ground, and a mixer parallel resonant circuit connected between said base and a signal ground; said voltage output effective in altering the capacitance of the collector-base junction and exclusively thereby the resonant frequency of said oscillator resonant circuit to an equilibrium frequency for accomplishing automatic frequency control.

3. A radio frequency receiver automatic frequency control comprising a discriminator to provide an electrical output proportional to the intermediate frequency impressed upon said discriminator and to provide modulation frequency variations, a filter connected to said discriminator to remove modulation frequency variations at the output of said filter, an oscillator transistor having an emitter, base and collector electrodes, an oscillatory circuit having only a parallel type resonant circuit, said resonant circuit connected to said collector electrode and to a radio frequency ground, one of said electrodes connected direct to ground, and the output of said filter conductively connected exclusively to one of said electrodes and through said resonant circuit; the frequency of said oscillatory circuit changed by a change of voltage on said one of said electrodes derived from said discriminator and poled to give an equilibrium oscillatory frequency for accomplishing automatic frequency control.

4. In an autodyne reecriver an automatic frequency control comprising a frequency discriminator circuit to give an electrical voltage output proportional only to the departure of the intermediate frequency of said receiver from a mean value, a single receiver oscillator and mixer junction transistor having an emitter, and collector and base electrodes, an oscillator inductor-capacitor parallel resonant circuit and said discriminator circuit conductively connected to one of said electrodes and to a signal ground, and a mixer parallel resonant circuit connected between said base and a signal ground; said voltage output effective in altering the capacitance of the collector-base junction and exclusively thereby the resonant frequency of said oscillator resonant circuit to an equilibrium frequency for accomplishing automatic frequency control.

References Cited in the file of this patent

UNITED STATES PATENTS

| | | |
|---|---|---|
| 2,362,000 | Tunick | Nov. 7, 1944 |
| 2,570,939 | Goodrich | Oct. 9, 1951 |
| 2,728,049 | Riddle | Dec. 20, 1955 |
| 2,764,687 | Buchanan et al. | Sept. 25, 1956 |
| 2,768,296 | Herzog | Oct. 23, 1956 |
| 2,782,310 | Kabell | Feb. 19, 1957 |
| 2,820,845 | Kabell | Jan. 21, 1958 |
| 2,857,573 | Lin | Oct. 21, 1958 |
| 2,888,648 | Herring | May 26, 1959 |
| 2,896,018 | Rhodes et al. | July 21, 1959 |